US008299403B2

(12) United States Patent
Ohmi et al.

(10) Patent No.: US 8,299,403 B2
(45) Date of Patent: Oct. 30, 2012

(54) HEAT RESISTING VACUUM INSULATING MATERIAL AND HEATING DEVICE

(75) Inventors: Tadahiro Ohmi, Miyagi (JP); Yasuyuki Shirai, Miyagi (JP); Sadao Kobayashi, Tokyo (JP); Yoshihide Wakayama, Tokyo (JP); Kazutaka Uekado, Osaka (JP)

(73) Assignees: National University Corporation Tohoku University, Miyagi (JP); Panasonic Corporation, Osaka (JP)

( * ) Notice: Subject to any disclaimer, the term of this patent is extended or adjusted under 35 U.S.C. 154(b) by 1042 days.

(21) Appl. No.: 12/298,192

(22) PCT Filed: Apr. 20, 2007

(86) PCT No.: PCT/JP2007/058580
§ 371 (c)(1),
(2), (4) Date: Oct. 23, 2008

(87) PCT Pub. No.: WO2007/125821
PCT Pub. Date: Nov. 8, 2007

(65) Prior Publication Data
US 2009/0184100 A1 Jul. 23, 2009

(30) Foreign Application Priority Data
Apr. 25, 2006 (JP) .................. 2006-120470

(51) Int. Cl.
*F23Q 7/22* (2006.01)
(52) U.S. Cl. ........................ 219/270; 219/267
(58) Field of Classification Search ............ 219/270, 219/260–269; 123/143 R–143 C; 428/68–76
See application file for complete search history.

(56) References Cited

U.S. PATENT DOCUMENTS
7,537,817 B2 * 5/2009 Tsunetsugu et al. ............ 428/69

FOREIGN PATENT DOCUMENTS

| JP | 52-171759 | 12/1977 |
|---|---|---|
| JP | 58-84495 | 6/1983 |
| JP | 60-208696 | 10/1985 |
| JP | 3-185715 | 8/1991 |
| JP | 5-11377 | 1/1993 |
| JP | 2000-310392 | 11/2000 |
| JP | 2004-162914 | 6/2004 |
| JP | 2005-36897 | 2/2005 |
| JP | 2005-214250 | 8/2005 |
| WO | 2004/094891 | 11/2004 |

OTHER PUBLICATIONS

International Search Report issued Jul. 24, 2007 in the International (PCT) Application No. PCT/JP2007/058580.

* cited by examiner

*Primary Examiner* — Daniel L Robinson
(74) *Attorney, Agent, or Firm* — Wenderoth, Lind & Ponack, L.L.P.

(57) ABSTRACT

A heating device includes a heat resisting vacuum insulator (4) wound around the outer periphery of an electric heater (3) disposed along the outer wall of an exhaust pipe (1), wherein the electric heater (3) has a resistance heating element and a heat resisting electric insulator covering this resistance heating element, and the heat resisting vacuum insulator (4) includes a hollow platy covering material air-tightly sealed thereinside by a metal seat (5) having a heat resisting temperature of at least 100° C., and a fibrous or granular filling material (6) filled in the hollow portion of this covering material and having a heat resisting temperature of at least 100° C., the inside of the covering material being kept in a vacuum state.

12 Claims, 3 Drawing Sheets

FIG.5 the body and/or the exhaust pipe of various vacuum devices such as vacuum devices for semiconductor circuit formation, and a heating device using the same.

HEAT RESISTING VACUUM INSULATING MATERIAL AND HEATING DEVICE

TECHNICAL FIELD

The present invention relates to a heat resisting vacuum insulator that can be suitably fitted to the body and/or the exhaust pipe of various vacuum devices such as vacuum devices for semiconductor circuit formation, and a heating device using the same.

BACKGROUND ART

In various vacuum devices conventionally used for semiconductor manufacturing such as sputtering devices, CVD (Chemical Vapor Deposition) devices and dry etching devices, high temperature active chemical species generated through reactions in such a device stick to the low temperature pipe walls of the vacuum device without being captured onto the semiconductor circuit substrate, then they become dust and scattered, and sticking of this dust to the semiconductor circuit substrate brings a drop in yield. The dust is discharged from the vacuum device, then cooled by the inner wall of its exhaust pipe and sticks and accumulates thereon, causing a phenomenon that the effective bore of the exhaust pipe gradually narrows.

When the effective bore of the exhaust pipe narrows in this way, the piping resistance to the exhaust gas becomes too great to continue vacuuming, and the operation of the vacuum device has to be suspended to scrape off the chemical species having clogged the exhaust pipe.

A conventional way of addressing this problem is to increase the capacity for allowing dust accumulation in the exhaust pipe by increasing its bore to somewhere between 150 and 200 mm and thereby to reduce the required frequency of cleaning.

However, this way of widening the bore of the exhaust pipe makes the capacity of the exhaust pipe greater than that of the vacuum device body, and discharging through the exhaust pipe requires enlarged exhaust capacity of the vacuum pump, entailing a big problem in energy efficiency.

The chemical species accumulating in the exhaust pipe, which are highly reactive with oxygen, would cause an abrupt combustion when coming into contact with air, often causing a fire. To avoid this risk, a conventional exhaust pipe, if deposits build up within, will have to be covered with a plastic sheet, for instance, all over the outside of its exhaust pipe, the exhaust piping being removed from the vacuum device body while letting inert gas flow within the plastic sheet and taken out in that state to scrape off the deposits by shearing. This causes a serious problem of hazardous work that must be done by a number of human actions.

Also, this clogging of the exhaust pipe has been a major bottleneck to the further development of the semiconductor industry as it not only brings down the utilization rate of the equipment but also requires a great amount of cleaning labor.

In view of these problems, the present inventors pursued research to solve the problems attributable to the adherence and accumulation of active chemical species in the exhaust pipes of such vacuum devices, and first discovered that unused chemical species could be prevented from sticking to the exhaust pipe by heating the outer wall of the vacuum device and the exhaust system to or above 140° C., preferably to about 150° C.

Then, the bore of the exhaust pipe of the vacuum device was reduced from the conventional 200 mm to 20 mm, and a heating device comprising an electric heater and a conventional insulator was attached for trial heating, leading to the finding that the required thickness of the insulating material for keeping warmth (that is, the thickness needed for keeping the surface temperature of the insulating material at the room temperature) was 100 to 150 mm. As a result, it was found that the external diameter of the exhaust pipe including the insulating material became around 250 to 350 mm, greater than the thickness of the conventional exhaust pipe.

Unlike this, the exhaust pipe of a conventional vacuum device of this kind is usually penetrated through the access floor on which the vacuum device is installed and the structural floor of the clean room (between which the circulating air of the clean room is passed) and reaches a vacuum pump downstairs. It therefore is made correspondingly more difficult to feed the heating device-equipped exhaust pipe which is greater in sectional area than a conventional pipe through the limited space under the floor on which the vacuum device is installed.

Thus it was found that, as the insulating performance of currently used insulating material would make the material too thick to enable the under-floor piping to be readily arranged, a better performing insulating material had to be employed and its required thickness should be reduced to ⅓ or less of glass wool, for instance. For this reason, it is conceivable to use as the insulating material, for instance, polyurethane foam which is superior to glass wool in insulating performance, but polyurethane foam can endure heat of up to 80° C. at most and is unusable where the regularly employed temperature to which it is exposed is 140° C. or above.

On the other hand, another known conventional vacuum insulating material is prepared by, as described in Patent Document 1 listed presently, sticking together composites each comprising an aluminum film formed by vapor deposition over a sheet of a specific resin as the supporting body, disposing a protective layer over it and providing an adhesive layer on the undersurface of the supporting body, the inner space between the composites being vacuumized and filled with silica powder.

However, this vacuum insulating material, intended for use in electrical household appliances such as cooking heaters or warmth keeping heaters, is only about 200 mm×300 mm in size. Vapor deposition is applicable to the formation of such a small film, but a vacuum insulating material of 1 m or more in length or one for use in industrial equipment or piping cannot be formed by vapor deposition.

The reason is that vapor deposition devices are hardly applicable for use with very large sheets of 1 m or more in length, and moreover it is difficult to fill the spaces in so large sheets uniformly with silica powder. In a semiconductor manufacturing apparatus, the vacuum chamber for 300 mm silicon wafers exceeds 600 mm in diameter and 1.8 m in circumferential length, while in a liquid crystal display panel manufacturing apparatus each side of its outer wall exceeds 3 m in length because it works on glass substrates of 2.2 m×2.3 m. The specified length of piping is usually 4 m. A vacuum insulating material to be used for such purposes is required to be longer than 1 m so as to ensure a reasonable level of working efficiency.

Patent Document 1: Japanese Patent Laid-Open No. 2000-310392

DISCLOSURE OF THE INVENTION

The present invention, attempted on the basis of those findings, is intended to provide a heat resisting vacuum insulator excelling in heat resistance and heat retaining property and a heating device which is enabled by the use of this material to prevent unused active chemical species from sticking to and accumulating on the inner walls of the bodies and/or exhaust pipes of various vacuum devices, thereby to solve dust-attributed problems in the bodies of such vacuum devices and the problem of clogging of the exhaust pipes, with the result that thinner exhaust pipes than conventional ones can be used and maintenance of the exhaust pipes.

In order to solve the problems noted above, the invention in its first aspect provides a heat resisting vacuum insulator comprising a hollow platy covering material which is airtightly sealed thereinside by a metal sheet having a heat resisting temperature of at least 100° C. and a filling material filled in the hollow portion of this covering material and having a heat resisting temperature of at least 100° C., wherein the inside of the covering material is kept in a vacuum state.

The invention in its second aspect provides a heat resisting vacuum insulator in the first aspect wherein the length thereof is 1 m or greater; the invention in its third aspect provides a heat resisting vacuum insulator in the first or second aspect wherein the use thereof in industrial machinery, equipment or piping; and the invention in its fourth aspect provides a heat resisting vacuum insulator in any of the first through third aspects wherein the covering material is formed to a thickness of 0.5 to 20 mm and the metal sheet is a stainless steel sheet or an aluminum sheet or a plastic laminate metal sheet of any of these metal sheets and a sheet made of polyethylene terephthalate, polyimide or polytetrafluoroethylene.

The invention in its fifth aspect provides a heat resisting vacuum insulator in any of the first through fourth aspects wherein the filling material is fibrous matter made up of one or more kinds of soda glass fibers, quartz fibers, shirasu (a specific type of light gray volcanic ash) fibers, alumina fibers, potassium titanate fibers and rock wool fibers or granular matter made up of glass beads, colloidal silica or shirasu beads.

On the other hand, the invention in its sixth aspect provides a heat resisting vacuum insulator in any of the first through fourth aspects wherein the filling material is fibrous matter or granular matter made up of a macromolecular material having a heat resisting temperature of at least 100° C.; and the invention in its seventh aspect provides a heat resisting vacuum insulator in the sixth aspect wherein the macromolecular material is one, or a combination of two or more, of polyester, aramid and polyimide.

The invention in its eighth aspect provides a heat resisting vacuum insulator in any of the first through seventh aspects wherein the fibrous filling material is formed by arranging a bundle of fibers arrayed in a single direction of the fiber length in a direction of crossing the direction of heat transmission.

The invention in its ninth aspect provides a heating device wound around the body and/or exhaust pipe of a vacuum device and capable of heating the outer wall of the body and/or exhaust pipe of the vacuum device to 100° C. or above, the heating device comprising a heat resisting vacuum insulator wound around the outer periphery of an electric heater disposed along the outer wall of the body and/or exhaust pipe of the vacuum device. The electric heater has a resistance heating element and a heat resisting electric insulator covering this resistance heating element. The heat resisting vacuum insulator comprises a hollow platy covering material airtightly sealed thereinside by a metal sheet having a heat resisting temperature of at least 100° C. and a fibrous, granular or micro-balloon-shaped filling material filled in the hollow portion of the covering material and having a heat resisting temperature of at least 100° C., and the inside of the covering material is kept in a vacuum state.

The invention in its tenth aspect provides a heating device in the ninth aspect wherein an insulating material made up of an inorganic material is provided between the heat resisting vacuum insulator and the electric heater; and the invention in its eleventh aspect provides a heating device in the tenth aspect wherein the insulating material is made up of quartz, glass not containing boron or calcium silicate and formed in a fibrous or granular shape.

The invention in its twelfth aspect provides the heating device in any of the ninth through eleventh aspects wherein the resistance heating element of the electric heater is a metallic resistance heating element or carbon-based resistance heating element which is a wire-shaped or planar item or a patterned planar item.

The invention in its thirteenth aspect provides a heating device in the twelfth aspect wherein the carbon-based resistance heating element is a sheet-shaped item made up of polyacrylonitrile carbon fibers, natural fiber-based carbon fibers or pitch-based carbon fibers, and the metallic resistance heating element is a wire-shaped or planar item or a patterned planar item made up of iron-chromium-based stainless steel, iron-chromium-nickel-based stainless steel, nickel-chromium alloy, copper-nickel alloy or tungsten alloy. To add, as the iron-chromium-based stainless steel SUS410 or SUS430 is suitable, and as the iron-chromium-nickel-based stainless steel, SUS304 is suitable.

The invention in its fourteenth aspect provides a heating device in any of the ninth through thirteenth aspects wherein the heat resisting insulator of the electric heater is an organic macromolecular material having a heat resisting temperature in normal use not lower than the heating temperature of the electric heater; and the invention in its fifteenth aspect provides a heating device in the fourteenth aspect wherein the organic macromolecular material is polyimide, polyamide imide, polysulphone, polytetrafluoroethylene or polyfluorvinylidene.

The heat resisting vacuum insulator in any of the first through eighth aspects enables only a small increase in thickness to exert a major heat insulating effect by being attached to the outer walls of various devices and their piping whose surface temperature reaches or surpasses 100° C. without an increase in the size of these devices or the diameter of their piping.

Incidentally, where a fibrous item is used as the filling material, if the fibers are arrayed at random, heat transmission will take place along the fibers arrayed in the direction of heat transmission, resulting in an increase in heat transmissivity and a drop in thermal insulating effect. In this respect, in the eighth aspect of the invention, as a fiber bundle in which fibers are arranged in the lengthwise direction of the fibers is used and adjoining fibers are in point contact with each other, the heat transmitted from one fiber to another can be minimized. Therefore, it is the most preferable to arrange the fiber bundle in a direction orthogonal to the direction of heat transmission. Applicable methods of arranging the fibers in one direction include, for instance, trimming a bundle of melt-spun fibers as it is.

Therefore, the heating device in any of the ninth through fifteenth aspects, synergy between the heat resisting vacuum insulator and a specific electric heater having a resistance heating element and a heat resisting electric insulator can prevent unused chemical species in the vacuum device from sticking to the inner walls of the device body, and accordingly prevent the yield from being reduced by the sticking of such species onto the semiconductor substrate as dust. Also, it is possible to significantly restrain the sticking of unused chemical species contained in the gas discharged from the vacuum device to the inner wall of the exhaust pipe, and in particular the sticking of such chemical species can be securely prevented by heating with the electric heater the outer wall of the exhaust pipe to 140° C. or above, preferably to about 150° C.

For this reason, the maintenance workload requiring hazardous work can be alleviated by substantially reducing the frequency of exhaust pipe cleaning, which has been performed periodically with the vacuum device suspended in the conventional practice. As a result, the utilization rate of expensive semiconductor manufacturing apparatuses, in which such vacuum devices are used, can be enhanced.

Also, the elimination of the chemical species sticking to the inner wall of the exhaust pipe enables the bore of the exhaust pipe of the vacuum device, which conventionally is 150 to 200 mm in diameter, to be reduced to between 10 and 50 mm, which is a sufficient diameter for essential exhaust, with the result that the capacity of the vacuum pump for exhaust discharge can be reduced and accordingly the discharge power requirement can be reduced to between ½ and ¹⁄₁₀ of that in use of a conventional exhaust pipe.

Furthermore, as this heating device occupies a small volume after it is fitted to the exhaust pipe of the vacuum device, when it is applied to a vacuum device as a semiconductor manufacturing apparatus for instance, the exhaust pipe of the apparatus laid underneath the clean room floor would require less adjustment with the arrangement of other installations, the execution or undertaking of both or entire working would be facilitated.

DESCRIPTION OF SYMBOLS

| | |
|---|---|
| 1 | Exhaust pipe |
| 2, 10, 20 | Heating device |
| 3 | Electric heater |
| 4 | Heat resisting vacuum insulator |
| 5 | Metal sheet |
| 6 | Filling material |
| 7 | Seal |
| 11, 21 | Insulating material |

BEST MODE FOR CARRYING OUT THE INVENTION

FIG. 1 through FIG. 5 show embodiments of application of inventive heat resisting vacuum insulators and heating devices using the same to exhaust pipes of vacuum devices for semiconductor circuit formation such as a sputtering device, a CVD device, a dry etching device or the like.

The heating device described above, wound around the outer wall of the exhaust pipe designated by reference numeral 1 in the drawings, is intended to heat the outer wall to 100° C. or above, preferably to 140° C. or above, more preferably to 150° C. or above and keep the external surface substantially at the room temperature level. Though there is no particular upper limit to the temperature, 200° C. or below would be sufficient with a view to saving energy and in view of the heat resistance of the vacuum insulating materials.

A vacuum device for semiconductor circuit formation in this context, though not shown, is a device for precipitating chemical components necessary for semiconductor circuit formation over a semiconductor substrate in a vacuum state; the device is one of a known structure in which the inlet/outlet for the substrate, a chemical substance inlet and a vacuum exhaust outlet to which the exhaust pipe 1 is connected are arranged. After inserting a semiconductor substrate into the vacuum device, the openings in the device are sealed and air and other gaseous substances in the device are discharged from the exhaust pipe 1 with a vacuum pump; the inside of the device can be turned into a vacuum state. Energy, such as heat or high frequency wave, applied from around the device while gaseous chemical substances are being supplied into the device kept in a vacuum state decomposes the gaseous chemical substances into solids, which are precipitated over the semiconductor substrate.

First Embodiment

Figure 1:
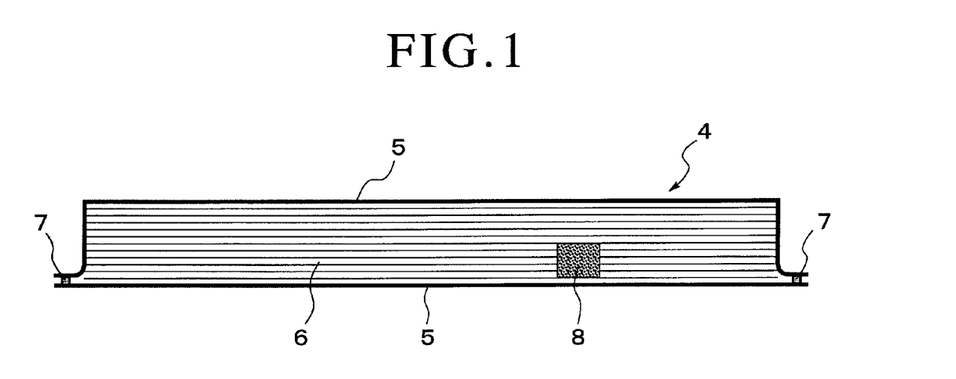
FIG. 1 is a longitudinal section showing a heat resisting vacuum insulator in a first embodiment of the present invention.
Figure 2:
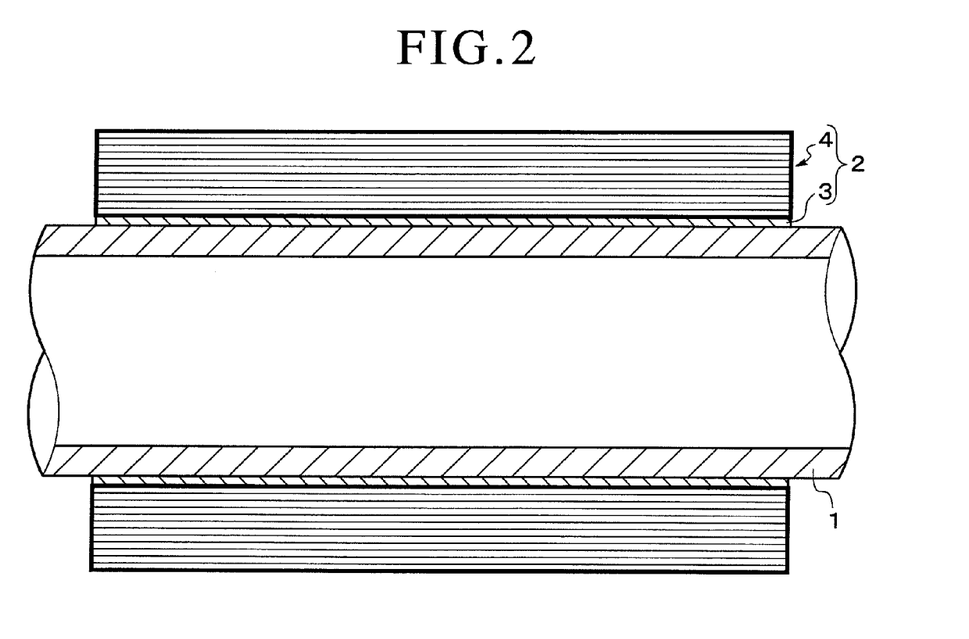
FIG. 2 is a longitudinal section showing a heating device in a second embodiment of the invention.

FIG. 1 and FIG. 2 show the heating device in a first embodiment, in which the heating device 2 is substantially composed of an electric heater 3 arranged along the outer wall of the exhaust pipe 1 and a heat resisting vacuum insulator 4 covering the outer periphery of the electric heater 3.

The electric heater 3 further comprises a resistance heating element and a heat resisting electric insulator made up of an organic macromolecular material and covering the resistance heating element.

The resistance heating element is a wire-shaped or sheet-shaped item made of a metallic or carbon-based material having a high electric resistance, which preferably may be 0.5 to 100Ω. Where a wire-shaped item is used as the resistance heating element, it is preferable that its thickness be between 50 and 1000 µm, and where a sheet-shaped item is used, it is preferable that its thickness be between 10 µm and 100 µm.

More specifically, suitable carbon-based resistance heating elements include sheets of polyacrylonitrile carbon fibers, natural fiber-based carbon fibers and pitch-based carbon fibers. Suitable metallic resistance heating elements include iron-chromium-based stainless steel (SUS410 or SUS430), iron-chromium-nickel-based stainless steel (SUS304), nickel-chromium alloy, copper-nickel alloy or tungsten alloy wire-shaped or planar items and any of the foregoing worked into a pattern.

The heat resisting electric insulator made of an organic macromolecular material to cover the resistance heating element needs to have a heat resisting temperature in normal use at or above the temperature of the electric heater and, though there is no particularly prescribed upper limit of temperature, as long as it is an organic macromolecular material, the upper limit of heat resistance of currently available heat resisting resins is, for instance, about 300° C. of polyimide. As the organic macromolecular material applicable to the heat resisting electric insulator, one of polyimide, polyamide imide, polysulphone, PTFE and polyfluorvinylidene can be used.

Any of these resins, if the resistance heating element is wire-shaped, is used in an electric wire form, with its outer periphery covered. If the resistance heating element is planar, one or both of its faces are covered with one of these heat resisting resins. Covering is accomplished by adhesion with a heat resisting adhesive or thermally laminated by melting under heating.

On the other hand, the heat resisting vacuum insulator 4 is a platy member which is formed by arranging, in a spaced confronting relation with each other, two square metal sheets 5 having a heat resisting temperature of at least 100° C. and in which vacuum is maintained by sealing the circumference with a seal 7 after the inside is filled with a fibrous or granular filling material 6 and thereby vacuumized, and is formed to a thickness of 0.5 to 20 mm. Incidentally, conventional vacuum insulating materials containing nothing like the filling material 6 are required to keep a degree of vacuum of around $10^{-5}$ Torr as in a thermos bottle for instance. By contrast, in the present invention the heat resisting vacuum insulator filled with the filling material 6 requires no such high degree of vacuum, but can readily achieve a high level of thermal insulation at a degree of vacuum of about 0.01 to 10 Torr, preferably 0.05 to 1.0 Torr.

It is preferable that the metal sheets 5 be stainless steel sheets, aluminum sheets (aluminum foils) or metal laminate plastic sheets each made up of any one type of these metal sheets and a polyethylene terephthalate, polyimide or polytetrafluoroethylene. The reason is that such sheets do not transmit air and are highly resistant to heat. It is preferable that the thickness of the metal sheets be 10 μm or more from the viewpoint of gas barrier performance and up to about 100 μm in view of handling limitations.

As the filling material 6 to fill the inner space, a fibrous matter such as soda glass fibers, quartz fibers, shirasu (a specific type of light gray volcanic ash) fibers, alumina fibers, potassium titanate fibers or rock wool fibers or a ball-shaped material such as glass beads, colloidal silica or shirasu beads can be used. For this purpose, borosilicate glass is undesirable because it generates gas of boric acid or the like.

Also, a fibrous or ball-shaped macromolecular material can be used as the filling material 6. When such a macromolecular material is used, too, it is preferable that the macromolecular material having at least 100° C. of a heat resisting temperature in normal use be processed into a fibrous or ball-shaped form; more specifically, fibers obtained by processing one or two materials out of polyester, aramid and polyimide are particularly suitable.

Further it is preferable that the inside of this heat resisting vacuum insulator 4 contains, in addition to the filling material 6, a getter material 8 for maintaining vacuum. As this getter material 8, a suitable substance that adsorbs gas such as water vapor, oxygen or some organic matter is used. Preferable specific examples include activated charcoal, zeolite, alkali metal or a compound thereof, alkaline earth metal, or a compound thereof in a tablet form substantially as thick as the filling material 6 and measuring 5 to 20 mm in diameter or in a hexahedron form measuring about 5 to 20 mm in width and length. The quantity of this material to be charged is about 2 milliliters per liter of the volume of the filling material 6.

Second Embodiment

Figure 3:
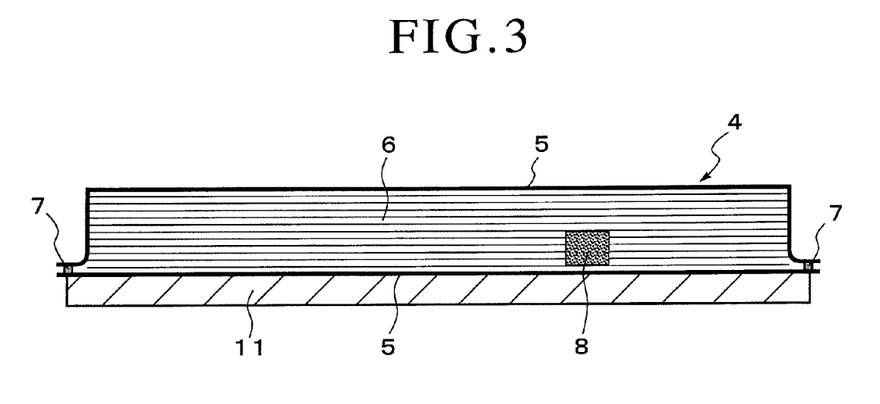
FIG. 3 is a longitudinal section showing a heat resisting vacuum insulator in a third embodiment of the invention.
Figure 4:
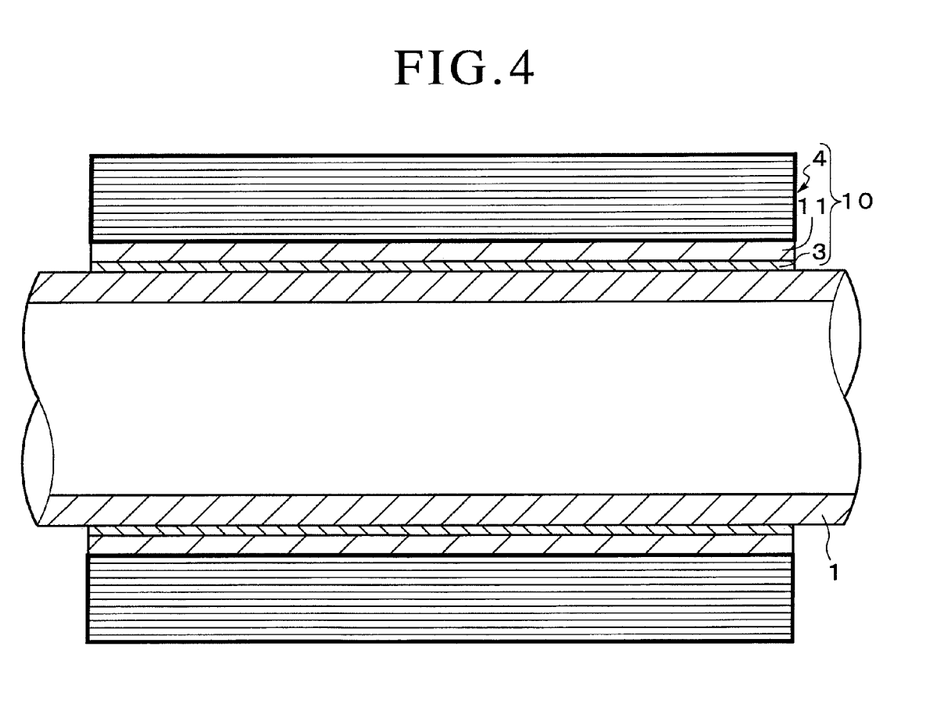
FIG. 4 is a longitudinal section showing a heating device in a third embodiment of the invention.
Figure 5:
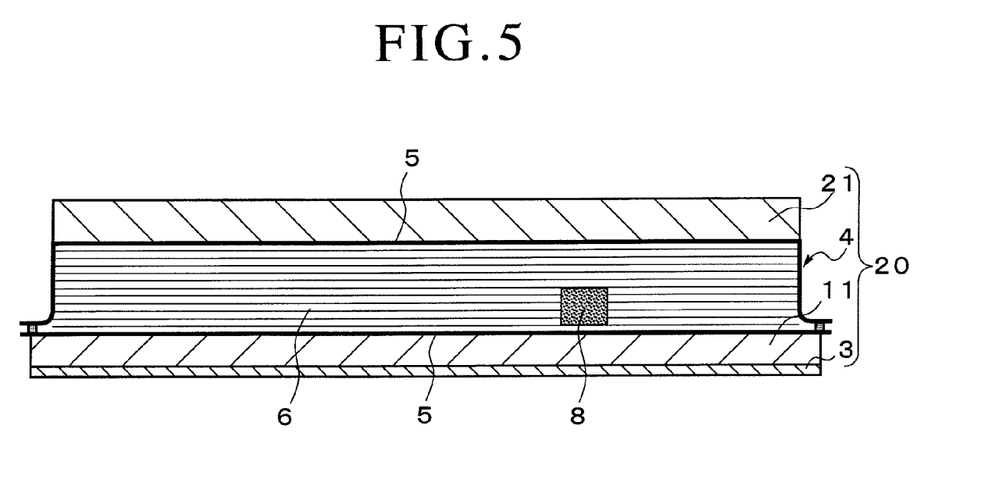
FIG. 5 is a longitudinal section showing a modified version of FIG. 4.

FIG. 3 through FIG. 5 show a second embodiment of the invention and a modified version of the same. The same constituent parts as those in FIG. 1 and FIG. 2 are assigned respectively the same reference signs, and their description is simplified.

As shown in FIG. 3 and FIG. 4, the heating device 10 has an insulating material 11, made up of an inorganic material, disposed between the heating device 2 and the exhaust pipe 1 in the first embodiment, while a heating device 20 shown in FIG. 5 has an insulating material 21, made up of an organic or inorganic material, wound around the outer periphery of the heating device 10 of FIGS. 3 and 4.

Inorganic materials usable for the insulating materials 11 and 21 include cloth knit of non-boron glass, such as soda glass, fibers or quartz fibers and calcium silicate boards. The reason why boron-containing glass fibers, such as borosilicate glass processed into fibers, are not used is to avoid the problem of diffusion of boron compounds from the glass, which will cause contamination of air in the clean room with boron.

The purposes of disposing the insulating materials 11 and 21 between the exhaust pipe 1 and the heating device 2 include, first to protect the heat resisting vacuum insulator 4 from vacuum breakage during the handling, second to supplementarily supply the thermal insulation performance, and third to have the intervention of an inorganic insulating material, where an organic adhesive is used as the vacuum seal 7 for the heat resisting vacuum insulator 4, between it and the electric heater 3, to prevent the heat resisting vacuum insulator 4 from being directly exposed to the heat of the electric heater 3, which would cause adhesive deterioration of the vacuum seal 7 part.

Unlike in this arrangement, as the insulating material 21 shown in FIG. 5, usable materials include organic foam polyurethane, foam polyethylene and foam styrene in addition to the inorganic insulating materials cited above. The purposes of winding the insulating material 21 around the outer periphery of the heat resisting vacuum insulator 4 include protection of the heat resisting vacuum insulator 4, integration of the insulating material in a readily workable shape and preserving provision of the insulating performance.

When working on the heating device 10 or 20 shown in FIG. 3 through FIG. 5, after installing a vacuum device not shown in a clean room and fitting the exhaust pipe 1 to the vacuum device, an integrated combination of the electric heater 3 and the insulating material 11 is wound around this exhaust pipe 1, the heat resisting vacuum insulator 4 is fitted and, if required, the insulating material 21 is further fitted. However, when it is desired to enhance the working efficiency or when working in a clean room which has to be free from dust is impossible, it is desired to combine the electric heater 3, the insulating material 11 and the heat resisting vacuum insulator 4 into an assembly in advance.

Of course, it is also acceptable to initially fit only the electric heater 3 to the exhaust pipe 1 and then fit thereto the heat resisting vacuum insulator 4 as shown in FIG. 1 and FIG. 2 or to fit a combination of the heat resisting vacuum insulator 4 and the insulating material 21. In these cases, openings are provided in advance to enable the heating device 2, 10 or 20 to be inserted outside the exhaust pipe 1. Where the exhaust pipe 1 is relatively thick, it is preferable to fit to the exhaust pipe 1 a combination made by at least bisecting the insulating materials 11 and 21 in the diametric direction.

Example 1

To assess the heating performances of the heating devices according to the invention and the insulating performances of the heat resisting vacuum insulators used therein, the following performance tests were carried out.

(1) Heat Resisting Vacuum Insulators

The heat resisting vacuum insulators were prepared in the following way.

For the metal sheet to constitute the covering for keeping the vacuum within each heat resisting vacuum insulator, a metallic foil basically having no gas transmissivity, such as an aluminum foil or a stainless steel foil was used. When an aluminum foil was used in particular, a plastic protective sheet was stuck to the atmosphere-facing surface of this foil to prevent it from being broken. On the vacuum side, it had an adhesive layer made up of an adhesive resin to apply sealing to maintain the vacuum.

For the filling material to be contained in the metal sheet, a molded item formed by heat-resistant fibrous, ball-shaped or otherwise shaped materials into a board of several millimeters in thickness was used. The fibrous matter used was an inorganic material such as soda glass or quartz glass and an organic material such as aramid resin or polyester resin. It is particularly preferable for the filling material to keep fibers in line contact with one another by using fibers having circular sections or keep balls in point contact with one another by using ball-shaped particles to reduce thermal conductivity. Yet, a fibrous filling material is more suitable because it can be shaped in a uniform thickness over a large area. Where fibers are used, it is particularly preferable to use the fibers in a bundled shape arrayed in one direction.

Each heat resisting vacuum insulator was fabricated in the following way. The filling material and a prescribed number of getter material units were placed between the two metal sheets and put into a vacuum device, all of them were vacuumized to a prescribed degree, and the adhesive layer was stuck by hot pressing the edges of the metal sheets in that state. The degree of vacuum used for the invention was from 0.05 to 5 Torr. When the metal sheets are to be sealed by brazing, soldering or welding, it is preferable to first thermally stick the adhesive by the method described above and then braze or weld the parts where the adhesive is absent.

As the filling material, fibers in a bundled shape in a thickness of 5 mm were used and, as the getter material for maintaining vacuum, production item as made by molding zeolite (a product of Tosoh Corporation) into a diameter of 10 mm and a thickness equal to that of the vacuum insulating material was used. The filling material and the getters were wrapped in two aluminum foils (a product of Hosokawa Yoko) of 400 mm in width and 1000 mm in length (with adhesion margins of 10 mm), and stuck with a heat resisting adhesive (a product of Toray Advanced Film) while being kept in a vacuum state of 0.1 Torr. Incidentally according to the present invention, production item produced by using soda glass as the filling material wrapped with aluminum foils is referred to as a vacuum insulating material A1 and production item produced by using organic fibers, for instance aramid fibers, as the filling material wrapped with aluminum foils is referred to as a vacuum insulating material B1. Production item produced by using soda glass as the filling material wrapped with stainless steel foils is referred to as a vacuum insulating material A2, and production item produced by using organic fibers, for instance aramid fibers, as the filling material wrapped with stainless steel foils is referred to as a vacuum insulating material B2.

(2) Assessment of Thermal Insulating Performances of Heat Resisting Vacuum Insulators The thermal insulating performances of the heat resisting vacuum insulators fabricated as described above were assessed in the following way. The coefficient of heat transmission (or heat transmissivity) was measured with Auto Lambda, a product of Eiko Seiki. Insulating material samples each measuring 400×1000 mm were inserted into the measuring section of this instrument, and the heat flow rates were measured with the heated side temperature and the temperature on the other side of the vacuum insulating material being kept at 38° C. and 10° C., respectively.

The measured heat transmissivities of the heat resisting vacuum insulators fabricated by the method described above were 0.0015 to 0.0050 W/mk for the vacuum insulating material A and 0.0020 to 0.0055 W/mk for the vacuum insulating material B.

(3) Electric Heater for Heating Use

A sheet heating element A on whose surface a stainless steel sheet (a product of Sumitomo Metal Industries) as the heating element was insulated with a belt-shaped polyimide film (Aurum, a product of Mitsui Chemicals) of 50 mm in width and 30 μm in thickness or a sheet heating element B (a product of Cosmotex Corporation) woven of stainless steel fibers as warps and aramid fibers as weft was used as the heating element was used.

Cases in which the materials cited above were applied to the exhaust piping for the vacuum devices for semiconductor manufacturing according to the invention will be described below.

Example 2

Example 2 is a case in which the heating device according to the invention was applied to a CVD device, and its details are stated in the Example 2 column of Table 1. In this example of the invention, an exhaust pipe of 22.2 mm in thickness was used for the CVD device, and the heating element A was used on its surface as the heater. In this example, the electric heater was divided into pieces, which were separately fitted to the exhaust pipe, valve and flange. Then, as an inorganic insulating material to be fitted over the electric heater, a glass fiber tape (a product of Takumi Sangyou Inc.) of 50 mm in width and 0.5 mm in thickness was wound around it.

Next, a heat resisting vacuum insulator A was arranged over it, and the glass fiber tape was wound around this material to fabricate the heating device according to the invention. The combined external diameter of the piping including the exhaust pipe, the heater and the vacuum insulating material was 42 mm. An A.C. source of 100 V was connected to this heating device, and the surface temperatures of the pipe and the valve were controlled between 155 and 160° C. with a temperature controller. Silane gas was directed to the CVD device to form a silicon CVD film over a silicon wafer under the conditions stated in Table 1. After repeating this experiment 50 times, the exhaust pipe was removed from the flange part fitted to the exhaust pipe of the CVD device, and the state of sticking matter inside was observed. The result was that sticking matter was scarcely found. The temperature outside the exhaust pipe was 25 to 27° C.

Example 3

Example 3 is a case in which the heating device according to the invention was applied as the heating device for a baking apparatus or a drying apparatus, and its details are stated in the Example 3 column of Table 1. In Example 3, an exhaust pipe of 34 mm in thickness was used for the heating device. As the electric heater for heating the surface of its straight part, a heating device of a unitary structure having an electric heater, an inorganic insulating material and a heat resisting vacuum insulator was used. A heating device for the straight part of the vacuum exhaust piping according to the invention was fabricated by arranging a semicircular glass fiber-based insulating material (a product of AF Trading Co.) of 35 mm in bore, 10 mm in thickness and 1000 mm in length as an inorganic insulating material outside a sheet heating element B of 3 mm in thickness, 65 mm in width and 1000 mm in length, the upper side of which was covered with a semicircular piece of the heat resisting vacuum insulator B1, and molding the whole structure by compression with a phenol adhesive to achieve thermal hardening.

This heating device was fitted to the exhaust pipe and fixed by winding a glass tape over it. A sheet heating element B was first wound around the flange part and the valve of the vacuum exhaust piping of this device, the parts so protected was covered with glass wool of 10 mm in thickness, using glass not containing boron, and the heat resisting vacuum insulator B was fitted to them. The combined external diameter of the piping including the exhaust pipe, the heater and the vacuum insulating material was 91 mm. The power cords were taken out separately between the straight part and the flange and valve parts and connected to a 100 V A.C. source. Temperatures outside the pipe and the valve were controlled with a temperature controller between 155 and 160° C. Nitrogen gas was directed into the heating device to bake a glass substrate-shaped ITO film. After repeating this experiment 30 times, the exhaust pipe was removed from the flange part fitted to the exhaust pipe of the heating device, and the state of sticking matter inside was observed. The result was that sticking matter was scarcely found. The temperature outside the exhaust pipe was 33 to 35° C.

Example 4

This example is a case in which stainless steel foils were used instead of the aluminum foils in Example 3 as the sealing material, and the heat resisting vacuum insulator B2 was used in this case. The stainless steel foils were soldered for vacuum sealing. In this case, this direct heat resisting vacuum insulator was used over the sheet heating element B to form a heat insulating layer without using any inorganic insulating material. An aluminum vapor deposition tape was wound around this layer for protection. The combined external diameter of the piping including the exhaust pipe, the heater and the vacuum insulating material was 90 mm. The heat insulating performance was sufficient. Sticking matter to the exhaust pipe was scarcely found.

Example 5

This example is a case in which the tested device was a dry etching device and micro-balloons of 0.01 mm in diameter were used, instead of fibers as the filling material of the heat resisting vacuum insulator. Stainless steel foils were used for covering and sealing the heat resisting vacuum insulator. The heat insulating performance of this heat resisting vacuum insulator is stated in the Example 5 column of Table 1. This heat resisting vacuum insulator was wound around the sheet heating element B and tested in the same way as in Example 3, and sticking matter to the exhaust piping was scarcely found. The temperature outside the exhaust pipe was about 30° C., testifying to a satisfactory heat insulating performance.

Comparative Example 1

Comparative Example 1 is a case in which the test in Example 2 was performed without heating as in the conventional practice. In this test, much sticking matter to the piping was found, and it was seen that thin piping would be clogged soon.

Comparative Example 2

Comparative Example 2 is a case in which, as in Example 2, a heating device and a vacuum insulating material were used, with the temperature of heating the piping altered to 90° C. and the state of sticking matter to the piping was observed. In this case, again, much sticking matter to the piping was found, indicating a high probability of clogging.

Comparative Example 3

Comparative Example 3 is a case in which the heating device of Example 2 was used as it was, and glass wool of 150 mm in thickness was used instead of the vacuum insulating material. In this case, the combined external diameter of the piping including the exhaust pipe, the heater and the glass wool was 340 mm. The test results indicated little sticking matter, the temperature outside the exhaust pipe (the glass wool side) was about 50° C. in spite of the thick insulating material used, indicating insufficient heat insulation.

TABLE 1

| Item | Class | Subclass | Unit, etc. | Example 2 | Example 3 | Example 4 | Example 5 |
|---|---|---|---|---|---|---|---|
| Application | Vacuum device | Type | | Plasma CVD device | Thermal CVD device | Plasma CVD device | Dry etching |
| | Process | Degree of vacuum | Torr | 1 | 5 | 1 | 0.5 |
| | | Energy source | | High frequency: 1.5 kW/200 V | Heater 2 KW | High frequency: 1.5 kW/200 V | 450 W |
| | | Level of high frequency | MHz | 13.56 | — | 13.56 | 13.56 |
| | Gas | Type | | $SiH_4$ | $SiH_4 + N_2O$ | $SiH_4$ | $CF_4$ |
| | | Flow rate | ml/min | 20 | 30 | 20 | 10 |
| | Substrate | Type | | Silicon wafer | Silicon wafer | Silicon wafer | Silicon wafer |
| | | Temperature (set) | ° C. | 300 | 600 | 300 | 400 |
| Exhaust system | Exhaust pipe | Material | | SUS | SUS | SUS | SUS |
| | | External diameter/ thickness of pipe | mm | 22.2/1.0 | 34/1.2 | 22.2/1.0 | 34/1.2 |
| Exhaust conditions | Vacuum pump (main) | Type | | Dry pump | Dry pump | Dry pump | Molecular pump |
| | | Capacity | L/min | 2,000 | 2,000 | 2,000 | 30,000 |

TABLE 1-continued

| | | | | | | | |
|---|---|---|---|---|---|---|---|
| Heater | Heating element | Material | | Stainless steel sheet | Stainless steel wire | Stainless steel sheet | Stainless steel wire |
| | | Shape | | Belt-shaped | Wire-shaped | Belt-shaped | Wire-shaped |
| | | Unit of shape | mm | 10 | 1 | 10 | 1 |
| | Insulator | Material | | Polyimide | Aramid fibers | Polyimide | Aramid fibers |
| | | Shape | | Film | Woven cloth | Film | Woven cloth |
| | Shaping | Method | | Worked on site | Thermo-compression bonding | Worked on site | Thermo-compression bonding |
| | | Cut sections | | — | 2 | — | 2 |
| | | Unit length | mm | — | 1200 | — | 1200 |
| Vacuum insulating material | Face material | Material | | Aluminum Foil | Aluminum Foil | Stainless steel Foil | Stainless steel Foil |
| | | Shape | | | | | |
| | | Thickness | mm | 0.02 | 0.02 | 0.2 | |
| | | Sealing method | | Soldering | Soldering | Brazing | Adhesive + soldering |
| | Filling material | Material | | Soda glass | Aramid | Aramid | Micro-balloons |
| | | Original shape | | Fibrous | Fibrous | Fibrous | Spherical |
| | | Original diameter | μm | 3 | 3 | 1 | 0.5 |
| | | Assembled shape | | Bundled | Bundled | Bundled | Pulverized |
| | | Assembled thickness | mm | 7 | 16 | 16 | 10 |
| | Getter | Material | | Zeolite | Same as left | Same as left | Same as left |
| | | Size (diameter × thickness) | mm | 10 × 7 | 10 × 16 | 10 × 16 | 10 × 10 |
| | | Degree of vacuum | Torr | 0.1 | 2 | 2 | 0.5 |
| | | Thermal insulation performance | W/mK | 0.0016 | 0.0043 | 0.0043 | 0.0025 |
| | | Heat transmissivity | | | | | |
| Inorganic insulating material | | Material | | Soda glass | Soda glass | Soda glass | Not used |
| | | Shape | | Tape-shaped | Integrated body | Integrated body | — |
| | | Thickness | mm | 0.5 | 10 | 10 | — |
| | | Method of use | Relative to vacuum insulating material | Sandwiched between two faces | Used for high temperature surface | Used for high temperature surface | — |
| Exhaust pipe diameter + heater + insulating material | | External diameter | mm | 42 | 91 | 90 | 57 |
| Test conditions | Heater power source | Voltage (A.C.) | V | 100 | 100 | 100 | 100 |
| | Heater | Set temperature | °C. | 160 | 155 | 155 | 170 |
| | Temperature of exhaust pipe inner face | Measured temperature | °C. | 157 | 152 | 152 | 167 |
| Test results | Number of tests conducted | | Times | 25 | 28 | 28 | 28 |
| | Stuck matter | Sticking thickness | mm | Not more than 0.2 | Not more than 0.2 | Not more than 0.2 | Not more than 0.2 |
| | Heat insulating effect | Temperature outside piping | °C. | 27-29 | 33-35 | 33-36 | 29-31 |

| Item | Class | Subclass | Comparative Example 1 | Comparative Example 2 | Comparative Example 3 |
|---|---|---|---|---|---|
| Application | Vacuum device | Type | Plasma CVD device | Plasma CVD device | Plasma CVD device |
| | Process | Degree of vacuum | 1 | 1 | 1 |
| | | Energy source | High frequency: 1.5 kW/200 V | High frequency: 1.5 kW/200 V | High frequency: 1.5 kW/200 V |
| | | Level of high frequency | 13.56 | 13.56 | 13.56 |
| | Gas | Type | $SiH_4$ | $SiH_4$ | $SiH_4$ |
| | | Flow rate | 20 | 20 | 20 |

TABLE 1-continued

| | | | | | |
|---|---|---|---|---|---|
| | Substrate | Type | Silicon wafer | Silicon wafer | Silicon wafer |
| | | Temperature (set) | 300 | 300 | 300 |
| Exhaust system | Exhaust pipe | Material | SUS | SUS | SUS |
| | | External diameter/thickness of pipe | 22.2/1.0 | 22.2/18 | 22.2/1.0 |
| Exhaust conditions | Vacuum pump (main) | Type | Dry pump | Dry pump | Dry pump |
| | | Capacity | 2,000 | 2,000 | 2,000 |
| Heater | Heating element | Material | Not used | Stainless steel sheet | Stainless steel sheet |
| | | Shape | — | Belt-shaped | Belt-shaped |
| | | Unit of shape | — | 10 | 10 |
| | Insulator | Material | — | Polyimide Film | Polyimide Film |
| | | Shape | — | | |
| | Shaping | Method | Not used | Worked on site | Worked on site |
| | | Cut sections | — | — | — |
| | | Unit length | — | — | — |
| Vacuum insulating material | Face material | Material | Not used | Aluminum Foil | Not used |
| | | Shape | — | | — |
| | | Thickness | — | 0.5 | — |
| | | Sealing method | — | Soldering | — |
| | Filling material | Material | — | Soda glass | — |
| | | Original shape | — | Fibrous | — |
| | | Original diameter | — | 3 | — |
| | | Assembled shape | — | Bundled | — |
| | | Assembled thickness | — | 7 | — |
| | Getter | Material | — | Zeolite | — |
| | | Size (diameter × thickness) | — | 10 × 7 | — |
| | | Degree of vacuum | — | 0.1 | — |
| | Thermal insulation performance | Heat transmissivity | — | 0.0016 | — |
| Inorganic insulating material | | Material | Not used | Soda glass | Soda glass |
| | | Shape | — | Tape-shaped | Integrated body |
| | | Thickness | — | 0.5 | 150 |
| | | Method of use | — | Sandwiched between two faces | Over heater |
| Exhaust pipe diameter + heater + insulating material | | External diameter | — | 41 | 340 |
| Test conditions | Heater power source | Voltage (A.C.) | — | 100 | 100 |
| | Heater | Set temperature | 23 | 90 | 170 |
| | Temperature of exhaust pipe inner face | Measured temperature | Device temperature | 88 | 165 |
| Test results | Number of tests conducted | | 28 | 28 | 28 |
| | Stuck matter | Sticking thickness | 6 | 5 | 0.2 |
| | Heat insulating effect | Temperature outside piping | 23 | 23 | 48-50 |

INDUSTRIAL APPLICABILITY

Since the heat resisting vacuum insulator according to the invention and the heating device using the same permit ready heating and warmth preservation despite the small overall thickness, they can be applied to various vacuum devices for semiconductor circuit formation including sputtering devices, CVD devices and dry etching devices, baking apparatuses and drying apparatuses.

The invention claimed is:

1. A heating device, wound around the body and/or exhaust pipe of a vacuum device and capable of heating an outer wall of the body and/or exhaust pipe of the vacuum device to 100° C. or above, the heating device comprising:

an electric heater disposed along the outer wall of said body and/or exhaust pipe of the vacuum device; and a heat resisting vacuum insulator wound around an outer periphery of said electric heater, wherein said electric heater has a resistance heating element and a heat resisting electric insulator covering said resistance heating element, and wherein said heat resisting vacuum insulator comprises a hollow platy covering material air-tightly sealed thereinside by a metal sheet having a heat resisting temperature of at least 100° C. and a fibrous, granular or microballoon-shaped filling material filled in the hollow portion of said covering material and having a heat resisting temperature of at least 100° C., and the inside of said covering material is kept in a vacuum state.

2. The heating device according to claim 1, wherein insulating material made up of an inorganic material is provided between said heat resisting vacuum insulator and said electric heater.

3. The heating device according to claim 2, wherein said insulating material is made up of quartz, glass not containing boron or calcium silicate and formed in a fibrous or granular shape.

4. The heating device according to claim 1, wherein the resistance heating element of said electric heater is a metallic resistance heating element or carbon-based resistance heating element which is a wire-shaped or planar item or a patterned planar item.

5. The heating device according to claim 1, wherein the resistance heating element of said electric heater is:

(i) a carbon-based resistance heating element which is a sheet-shaped item made up of polyacrylonitrile carbon fibers, natural fiber-based carbon fibers or pitch-based carbon fibers, or (ii) a metallic resistance heating element which is a wire-shaped or planar item or a patterned planar item, and which is made up of iron-chromium-based stainless steel, iron-chromium-nickel-based stainless steel, nickel-chromium alloy, copper-nickel alloy or tungsten alloy.

6. The heating device according to claim 1, wherein the heat resisting insulator of said electric heater is an organic macromolecular material having a heat resisting temperature in normal use not lower than the heating temperature of said electric heater.

7. The heating device according to claim 6, wherein said organic macromolecular material is polyimide, polyamide imide, polysulphone, polytetrafluoroethylene or polyfluorvinylidene.

8. The heating device according to claim 1, wherein the resistance heating element of said electric heater is a carbon-based resistance heating element which is a sheet-shaped item made up of polyacrylonitrile carbon fibers, natural fiber-based carbon fibers or pitch-based carbon fibers.

9. The heating device according to claim 1, wherein the resistance heating element of said electric heater is a metallic resistance heating element which is a wire-shaped or planar item or a patterned planar item, and which is made up of iron-chromium-based stainless steel, iron-chromium-nickel-based stainless steel, nickel-chromium alloy, copper-nickel alloy or tungsten alloy.

10. The heating device according to claim 1, wherein the resistance heating element of said electric heater is a carbon-based resistance heating element which is made up of polyacrylonitrile carbon fibers, natural fiber-based carbon fibers or pitch-based carbon fibers.

11. The heating device according to claim 1, wherein the resistance heating element of said electric heater is a metallic resistance heating element which is made up of iron-chromium-based stainless steel, iron-chromium-nickel-based stainless steel, nickel-chromium alloy, copper-nickel alloy or tungsten alloy.

12. The heating device according to claim 1, wherein the heat resisting vacuum insulator has a thickness of 0.5 to 20 mm.

* * * * *